(12) United States Patent
Yun

(10) Patent No.: US 9,894,309 B2
(45) Date of Patent: Feb. 13, 2018

(54) RAMP SIGNAL GENERATOR, AND CMOS IMAGE SENSOR USING THE SAME

(71) Applicant: SK hynix Inc., Gyeonggi-do (KR)

(72) Inventor: Gun-Hee Yun, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 21 days.

(21) Appl. No.: 15/202,339

(22) Filed: Jul. 5, 2016

(65) Prior Publication Data

US 2017/0195601 A1    Jul. 6, 2017

(30) Foreign Application Priority Data

Dec. 30, 2015  (KR) .......................... 10-2015-0189274

(51) Int. Cl.
| | | |
|---|---|---|
| H04N 5/378 | (2011.01) | |
| G05F 3/26 | (2006.01) | |
| H03K 4/48 | (2006.01) | |
| H04N 5/357 | (2011.01) | |
| H04N 5/3745 | (2011.01) | |
| H03K 4/02 | (2006.01) | |

(52) U.S. Cl.
CPC ............. *H04N 5/378* (2013.01); *G05F 3/262* (2013.01); *H03K 4/026* (2013.01); *H03K 4/48* (2013.01); *H04N 5/3575* (2013.01); *H04N 5/37455* (2013.01)

(58) Field of Classification Search
CPC .. H04N 5/378; H04N 5/37455; H04N 5/3575; G05F 3/262; H03K 4/48
See application file for complete search history.

(56) References Cited

U.S. PATENT DOCUMENTS

| 9,143,119 B2 * | 9/2015 | Sohn ..................... H03K 5/1252 |
| 2012/0153921 A1 * | 6/2012 | Brokaw ................ H02M 3/156 323/288 |

FOREIGN PATENT DOCUMENTS

| KR | 100574910 | 7/2006 |
| KR | 1020140140708 | 12/2014 |

* cited by examiner

*Primary Examiner* — Mekonnen Dagnew
(74) *Attorney, Agent, or Firm* — IP & Group LLP

(57) ABSTRACT

A ramp signal generator may include a reference current generation unit suitable for generating a reference current based on a gain; a ramp signal generation unit suitable for generating a ramp signal according to the reference current; a replica current supply unit suitable for supplying a replica current using the reference current generation unit; and an offset compensation unit suitable for compensating for an offset of the ramp signal generated by the ramp signal generation unit using the replica current.

17 Claims, 6 Drawing Sheets

RAMP SIGNAL GENERATOR, AND CMOS IMAGE SENSOR USING THE SAME

CROSS-REFERENCE TO RELATED APPLICATIONS

The present application claims priority of Korean Patent Application No. 10-2015-0189274, filed on Dec. 30, 2015, which is incorporated herein by reference in its entirety.

BACKGROUND

1. Field

Exemplary embodiments of the present invention relate generally to a complementary metal oxide semiconductor (CMOS) image sensor and, more particularly, a ramp signal generator for providing a constant output voltage (or ramp signal) in case of a full code and a CMOS image sensor (CIS) using the same.

In the following descriptions, a current digital-analog converter (IDAC) is described as an example of the ramp signal generator. However, the present invention is not limited thereto.

2. Description of the Related Art

In general, a Correlated Double Sampling (CDS) operation of a CIS has a characteristic significantly variable according to a common-mode voltage, and such a characteristic variation may serve as a factor of degrading the image quality of the CIS.

For example, a comparator with a single-end, AC-coupled input for a small-area CIS determines the common-mode voltage of the CDS operation according to an output voltage (or ramp signal) of a current digital-analog converter (IDAC) which is a ramp signal generator.

Thus, in the case of employing an IDAC for generating a ramp signal using a reference current change, when a ramp signal is changed according to the reference current based on a gain, a common-mode voltage of a CDS operation (that is, voltage in case of a full code) may be changed. As a result, the image quality of the CIS may be degraded.

SUMMARY

Various embodiments of the present invention are directed to a ramp signal generator capable of providing a constant output voltage, or output current, and a CIS using the same. The ramp signal, generator may control its output voltage by generating a replica current from a reference current source generating a reference current, thereby providing a constant output voltage, or output current.

In an embodiment of the present invention, a ramp signal generator may include: a reference current generation unit suitable for generating a reference current based on a gain; a ramp signal generation unit suitable for generating a ramp signal according to the reference current; a replica current supply unit suitable for supplying a replica current using the reference current generation unit; and an offset compensation unit suitable for compensating for an offset of the ramp signal generated by the ramp signal generation unit using the replica current.

In an embodiment of the present invention, a CIS may include: a pixel array suitable for outputting a pixel signal corresponding to incident light; a row decoder suitable for selecting and controlling pixels within the pixel array for each row line according to a control of a control unit; a ramp signal generator suitable for generating a ramp signal according to the control of the control unit, and compensating for the generated ramp signal by supplying a replica current to its output terminal; a comparison unit suitable for comparing pixel signals outputted from the pixel array to the ramp signal outputted from the ramp signal generator a counting unit suitable for counting a clock applied from the control unit according to output signals from the comparison unit a memory unit suitable for storing counting information applied from the counting unit according to the control of the control unit; and a column readout circuit suitable for outputting data of the memory unit under the control of the control unit, wherein the ramp signal generator comprises a plurality of current mirror paths for supplying currents to be used to generate the ramp signal, and the replica current is derived from the plurality of current mirror paths.

DETAILED DESCRIPTION

Figure 1:
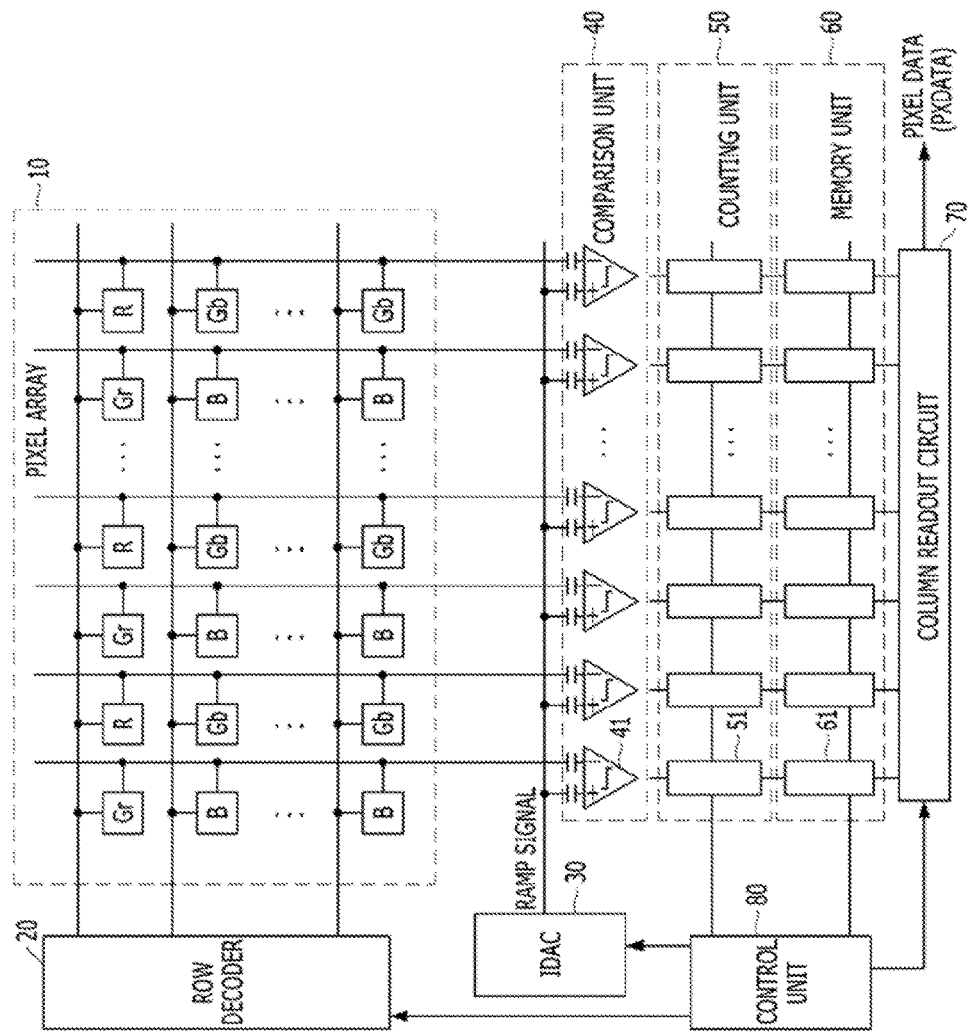
FIG. 1 is a circuit diagram illustrating a conventional CIS.

Various embodiments of the present invention will be described below in more detail with reference to the accompanying drawings. The present invention may, however, be embodied in different forms and should not be construed as being limited to the embodiments set forth herein. Rather, these embodiments are provided so that the disclosure of the present invention will be thorough and complete. Throughout the disclosure, like reference numerals refer to like parts throughout the various figures and embodiments of the present invention.

It will be understood that, al though the terms "first", "second" "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein singular forms are intended to include the plural forms as well, unless the context clearly indicates otherwise.

It will be further understood that the terms "comprises", "comprising" "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

FIG. 1 is a circuit diagram illustrating a conventional CIS having a column parallel architecture.

Referring to FIG. 1, the CIS includes a pixel array 10, a row decoder 20, a current digital-analog converter (IDAC) 30, a comparison unit 40, a counting unit 50, a memory unit 60, a control unit 80 and a column readout circuit 70. The pixel array 10 outputs a pixel signal corresponding to incident light. The row decoder 20 selects pixels within the pixel array 10 for each row line according to control of the control unit 80 (for example, timing generator), and controls the operations of the selected pixels. The IDAC 30 generates a ramp signal according under the control of the control unit 80. In operation, the comparison unit 40 compares the values of pixel signals outputted from the pixel array 10 to the ramp signal inputted from the IDAC 30. Also, the counting unit 50 counts a clock inputted from the control unit 80 according to output signals of the comparison unit 40. The memory unit 60 then stores the counting information inputted from the counting unit 50 according to control of the control unit 80. The control unit 80 can control the operations of the row decoder 20, the IDAC 30, the counting unit 50, the memory unit 60 and the column readout circuit 70. The column readout circuit 70 sequentially outputs the data of the memory unit 60 as pixel, data PXDATA according to control of the control unit 80.

For removing an offset value of each pixel, the CIS compares pixel signals (pixel output voltages) before and after a light signal is entered, and measures only a pixel signal generated by the incident light. Such a technique is referred to as CDS (Correlated Double Sampling). The CDS operation is performed by the comparison unit 40.

Typically, the comparison unit 40 includes a plurality of comparators, the counting unit 50 includes a plurality of counters, and the memory unit 60 includes a plurality of memories. The plurality of comparators, counters, and memories are arranged in columns, each column having one comparator, one counter and one memory as shown in FIG. 1.

Next, the operation of a comparator, counter and memory (analog-digital conversion operation) will be described as follows.

First, a first comparator 41 receives a pixel signal outputted from the first column of the pixel array 10 through one terminal thereof, receives a ramp signal $V_{RAMP}$ inputted from the IDAC 30 through the other terminal thereof, compares the values of the two signals, and outputs a comparison signal.

At this time, since the ramp signal $V_{RAMP}$ has a voltage level which is decreasing over time, the values of two signals which are inputted to each comparator meet each other at a certain time point. After the point of time that the values of the two signals meet each other, the value of the comparison signal outputted from each comparator is inverted.

Thus, the first counter 51 counts the clock inputted from the control unit 80 from the point of time that the ramp signal falls to the point of time that the comparison signal outputted from the comparator 41 is inverted, and outputs the counting information. Each of the counters is reset according to a reset signal from the control unit.

Then, the first memory 61 stores the counting information provided from the counter 51 according to a load signal from the control unit 80, and outputs the stored counting information to the column readout circuit 70.

FIGS. 2A to 2D are diagrams illustrating the configuration and waveform of a comparator 41 of one of the columns of FIG. 1.

Figure 2A:
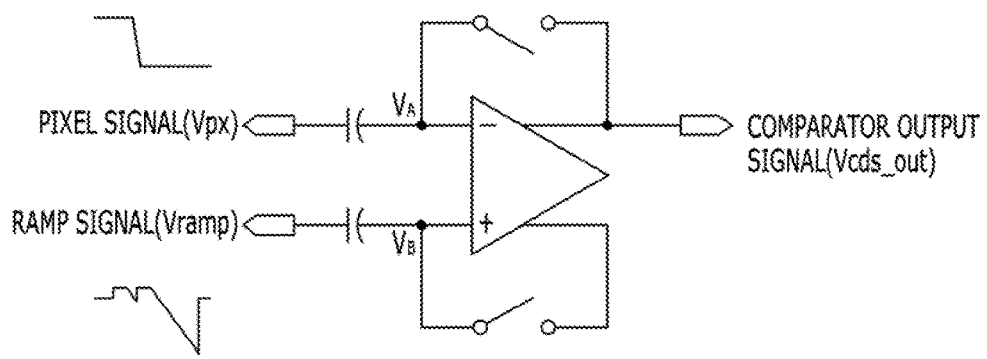
FIGS. 2A to 2D are diagrams illustrating the configuration and waveform of a comparator at one column of the CIS shown in FIG. 1.
Figure 2B:
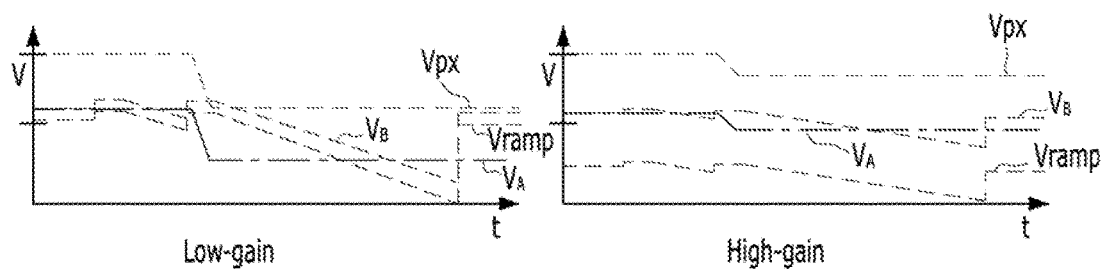
Figure 2C:
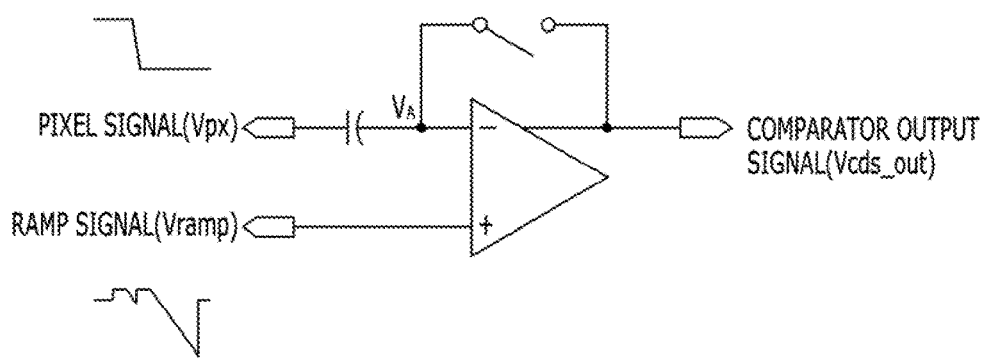
Figure 2D:
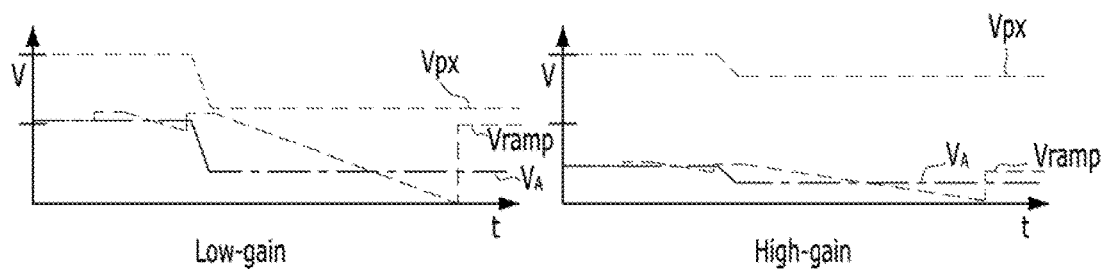

FIGS. 2A and 2B illustrate a CDS operation and waveform changes when the comparator positioned at one column is a comparator with differential AC-coupled inputs. FIGS. 2C and 2D illustrate a CDS operation and waveform changes when the comparator positioned at one column is a comparator with a single-end AC-coupled input.

When the comparator has differential AC-coupled inputs as illustrated in FIGS. 2A and 2B, an input voltage of an input node VA of a first stage comparator is retained as the same consistent common-mode voltage of the CDS operation at all times. In this case, the input voltage of the input node falls within a stable operation range even at a low gain or high gain.

Figure 3:
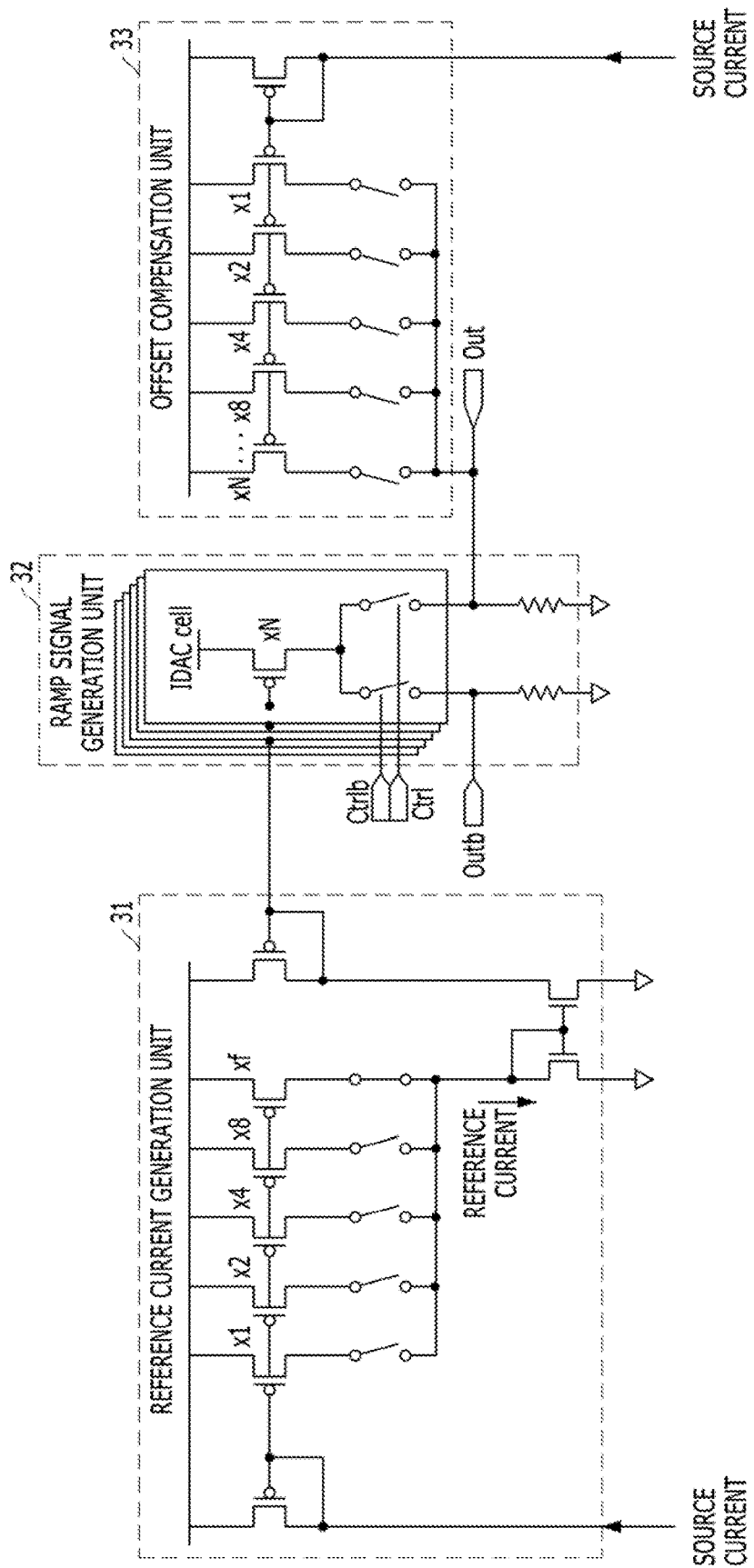
FIG. 3 is a configuration diagram of a conventional IDAC employed in the CIS shown in FIG. 1.

However, when the comparator is a comparator with a single-end AC-coupled input as illustrated in FIGS. 2C and 2D, an input voltage of an input node VA of a first stage comparator changes to a common-mode voltage of the CDS operation, the common-mode voltage being changed depending on the ramp signal (ramp voltage) which is changed according to a gain. In this case, the input voltage of the input node is highly likely to fall within a stable operation range at a low gain. However, the input voltage may have a considerably low voltage at a high gain, and thus cannot guarantee a stable CDS operation. Referring to FIG. 3, a conventional IDAC which has heretofore been used for solving such a problem is described.

FIG. 3 is a configuration diagram of a conventional IDAC 30. As illustrated in FIG. 3, the IDAC 30 includes a reference current generation unit 31, a ramp signal generation unit 32 and an offset compensation unit 33. The reference current generation unit 31 may generate a reference current based on a gain. The ramp signal generation unit 32 may generate a ramp signal according to the reference current from the reference current generation unit 31. The offset compensation unit 33 may compensate for an offset of the ramp signal generated by the ramp signal generation unit 32.

The reference current generation unit 31 may receive a source current from an external current supply unit (not illustrated), generate a reference current which is changed according to a gain, and transmit the generated reference current to the ramp signal generation unit 32. At this time, since the reference current generation unit 31 can be implemented with a reference current conversion circuit using a general 1:N current mirror circuit where N is a natural number, the detailed descriptions thereof are omitted herein.

The ramp signal generation unit 32 includes a plurality of IDAC cells for generating a ramp signal according to the reference current from the reference current generation unit 31 and an output resistor for outputting the ramp signal generated through the plurality of IDAC cells. At this time, the plurality of IDAC cells may generate the ramp signal by adjusting the number of transistors coupled thereto, for example. The reference current generation unit 31 and the ramp signal generation unit 32 may be connected to each other in a current mirror type. Since the other circuit components are publicly known, detailed descriptions thereof are omitted herein.

The offset compensation unit 33 may be coupled to an output terminal of the ramp signal generation unit 32, and compensate for an offset of the ramp signal generated through the ramp signal generation unit 32. That is, the offset compensation unit 33 may adjust the DC level of the ramp signal (ramp voltage) generated through the ramp signal generation unit 32. At this time, since the offset compensation unit 33 can be implemented with a general 1:N current mirror circuit like the reference current generation unit 31, detailed descriptions thereof are omitted herein.

As described above, the IDAC 30 of FIG. 3 require a separate current mirror circuit to compensate for an offset of the ramp signal. Thus, the circuit area is inevitably increased.

An improved IDAC, according to an embodiment of the present invention, may generate a replica current from the reference current generation unit, and constantly retain an output voltage (or output current) using the replica current in case of a full code, without increasing the circuit area by adding a separate current mirror circuit for compensating for an offset of the ramp signal and will be described in reference to FIG. 4.

Figure 4:
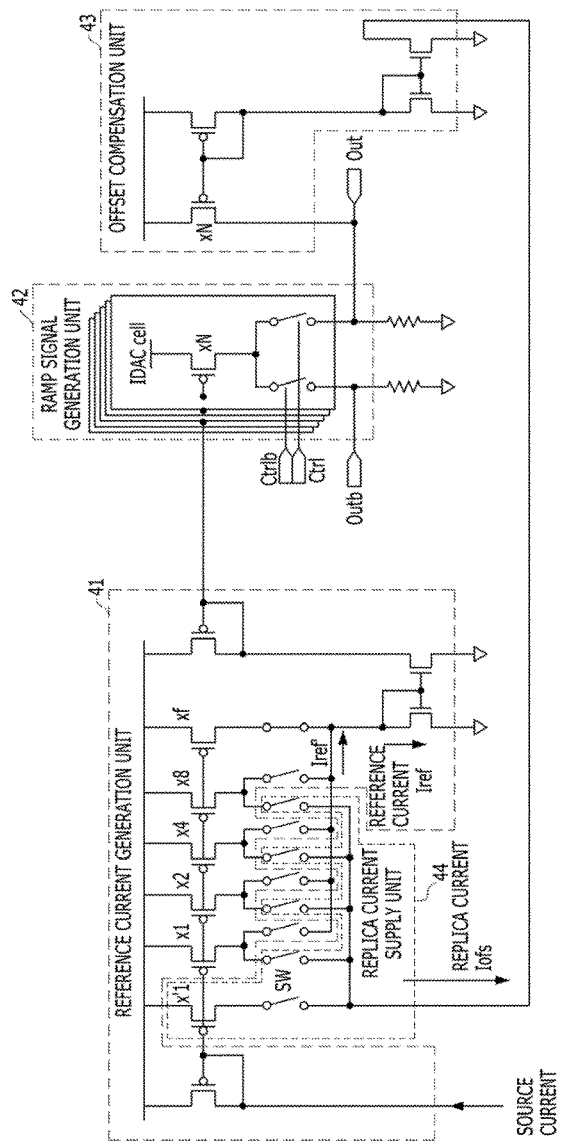
FIG. 4 is a configuration diagram of an IDAC 30 in accordance with an embodiment of the present invention.

As illustrated in the embodiment of FIG. 4, an IDAC 40, according to an embodiment of the present invention, may include a reference current generation unit 41, a ramp signal generation unit 42, a replica current supply unit 44 and an offset compensation unit 43. The reference current generation unit 41 may generate a reference current according to a gain. The reference current generation unit 41 may include a plurality of current mirror paths. The reference current generation unit 41 may generate the reference current from one or more current mirror paths selected from among the plurality of current mirror paths. The ramp signal generation unit 42 may generate a ramp signal according to the reference current from the reference current generation unit 41. The replica current supply unit 44 may generate a replica current using the reference current generation unit 41. The offset compensation unit 43 may compensate for an offset of the ramp signal generated by the ramp signal generation unit 42 using the replica current from the replica current supply unit 44.

At this time, the replica current supply unit 44 may supply the replica current (reference current for offset compensation) to the offset compensation unit 43, using one or more remaining current mirror paths, except for the current mirror paths selected by the reference current generation unit 41 to generate the reference current.

Each of the reference current generation unit 41 and the replica current supply unit 44 may include a plurality of switches SW for selecting the respective current mirror paths. Each of the switches SW may be switched according to a switching control signal from an external control unit (not illustrated) to select the current mirror paths for generating a reference current or supplying a replica current.

The replica current supply unit 44 may select some of the remaining current mirror paths according to an offset compensation ratio which is preset relative with the reference current generated from the current mirror paths selected by the reference current generation unit 41 to generate a replica current, and supply the replica current to the offset compensation unit 43.

In FIG. 4, a current mirror path xf may supply a basic current. Further, current mirror paths x1 and x'1 may supply the same current as the basic current. Current mirror path x2 may supply two times the basic current. Current mirror path x4 may supply four times the basic current. Current mirror path x8 may supply eight times the basic current. The current mirror path xf may constantly supply the basic current. The current mirror paths x'1, and x1 to x8 may selectively supply or interrupt the currents by switching on or switching off each of the switches placed in the current mirror paths. The current mirror path x'1 may be only used to generate the replica current, but not the reference current. The reference current Iref may be a sum of the basic current on the current mirror path xf and a variable current Iref' provided through the current mirror paths selected by the reference current generation unit 41.

For example, when the reference current generation unit 41 selects the current mirror path x1 the replica current supply unit 44 may select the current mirror paths x'1, x2 and x4 according to a preset offset compensation ratio. Accordingly the reference current Iref generated by the reference current generation unit 41 may be two times the basic current, i.e., a sum of the basic current on, the path xf and the variable current Iref' on the path x1. The replica current supplied by the replica current supply unit 44 may be seven times the basic current, i.e., a sum of the currents on the paths x'1, x2 and x4. When the reference current generation unit 41 selects the current mirror path x2, the replica current supply unit 44 may select the current mirror paths x'1, x1 and x4 according to the preset offset compensation ratio. Accordingly, the reference current Iref generated by the reference current generation unit 41 may be three times the basic current, i.e., a sum of the basic current on the path xf and the variable current Iref' on the path x2 and the replica current supplied by the replica current supply unit 44 may be six times the basic current, i.e., a sum of the currents on the paths x'1, x1 and x4. When the reference current generation unit 41 selects the current mirror path x4, the replica current supply unit 44 may select the current mirror paths x'1, x1 and x2 according to the preset offset compensation ratio. Accordingly, the reference current Iref generated by the reference current generation unit 41 may be five times the basic current, i.e., a sum of the basic current on the path xf and the variable current Iref' on the path x4 and the replica current supplied by the replica current supply unit 44 may be four times the basic current, i.e., a sum of the currents on the paths x'1, x1 and x2. When the reference current generation unit 41 selects the current mirror path x8, the replica current supply unit 44 may not select any current mirror path according to the preset offset compensation ratio.

As such, the replica current supplied to the offset compensation unit 43 from the replica current supply unit 44 may be coupled to the output terminal of the IDAC, and adjust (compensate for) the DC level of the ramp voltage (ramp signal) outputted from the IDAC.

Figure 5:
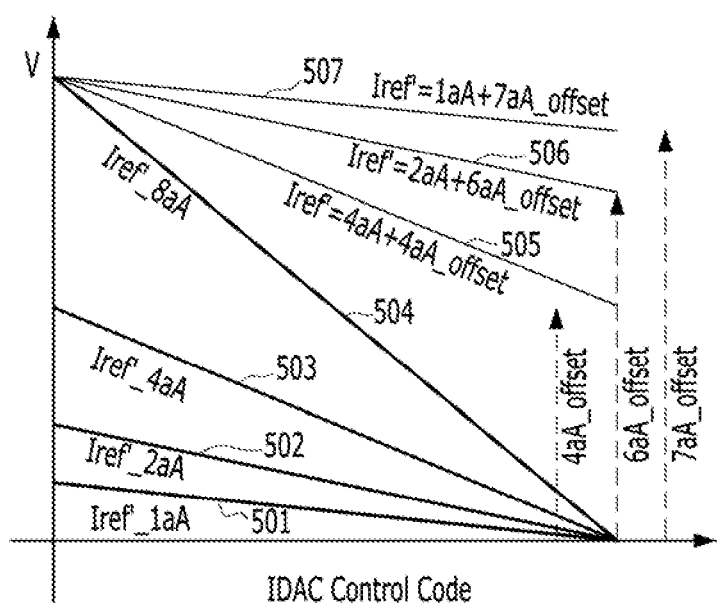
FIG. 5 is a diagram illustrating the relationship between output voltages and offset compensation values of an IDAC in accordance with an embodiment of the present invention.

FIG. 5 is a diagram illustrating the relationship between output voltages of the IDAC, according to an embodiment of the present invention and offset compensation values.

In FIG. 5, reference numerals 501 to 504 represent output voltage changes of the IDAC based on the variable current Iref' leading to the reference current Iref, and reference numerals 505 to 507 represent offset compensation values based on the variable current Iref'.

Since the IDAC, according to an embodiment of the present invention includes a PMOS current source and impedance coupled to a ground voltage, the maximum value of an output voltage of the IDAC may be determined in proportion to the reference current, and the minimum value may become zero.

In this case, an analog circuit (the comparison unit to perform a CDS operation) which receives the output voltage of the IDAC may not be normally operated, because the input voltage level decreases when the reference current is decreased or the gain is increased.

At this time, when the replica current supply unit 44 according to an embodiment of the present invention is added to compensate for the decreased output voltage value of the IDAC, a compensation current may flow through an added replica path, thereby raising the output voltage level of the IDAC.

Furthermore, as the replica current supply unit 44 is controlled for selecting the remaining current mirror paths according to the offset compensation ratio which preset relative with the reference current from the current mirror paths selected by the reference current generation unit 41, the maximum value of the output voltage of the IDAC may be maintained constant at all times.

In an embodiment of the present invention, the case in which the reference current of the IDAC is changed at a ratio of 1:N has been taken as an example. In another embodiment, however, the reference current may be changed at various ratios of N:1, N:M and the like.

As described above, the voltage or current of a specific region (for example, full-on or full-code region) in the IDAC, which is changed by a variation of the reference current, may be maintained constant at all times. Thus, stability of the operation of the analog circuit (the comparison unit to perform a CDS operation) which is based on the output voltage from the IDAC may be improved.

In accordance with an embodiment of the present invention, the replica current may be supplied to the output terminal of the IDAC using the reference current generation unit, and the output voltage (or output current) in case of a full code can be constantly retained without increasing the circuit area by adding a separate current mirror circuit for compensating an offset of the ramp signal.

Furthermore, as the voltage of the IDAC in case of a full code is constantly retained and outputted, the common-mode voltage of the CDS operation can be constantly retained to improve the constancy of the analog circuit characteristic.

Although various embodiments of the present invention have been described for illustrative purposes, it will be apparent to those skilled in the art that various changes and modifications may be made without departing from the spirit and scope of the invention as defined in the following claims.

What is claimed is:

1. A ramp signal generator comprising:
a reference current generation circuit suitable for generating a reference current based on a gain;
a ramp signal generation circuit suitable for generating a ramp signal according to the reference current;
a replica current supply circuit suitable for supplying a replica current using the reference current generation unit; and
an offset compensation circuit suitable for compensating for an offset of the ramp signal generated by the ramp signal generation unit using the replica current.

2. The ramp signal generator of claim 1, wherein, when the reference current generation circuit generates the reference current from one or more current mirror paths selected from a plurality of current mirror paths, the replica current supply circuit generates the replica current from remaining current mirror paths not selected by the reference current generation unit.

3. The ramp signal generator of claim 2, wherein the replica current supply circuit comprises a plurality of switches suitable for selecting the remaining current mirror paths.

4. The ramp signal generator of claim 2, wherein the replica current is derived by aggregating currents from one or more current mirror paths of the remaining current mirror paths.

5. The ramp signal generator of claim 2, wherein the replica current supply circuit further comprises a separate current mirror path used to generate the replica current only.

6. The ramp signal generator of claim 4, wherein the separate mirror current path is passed or interrupted by switching on or switching off a switch placed in the separate mirror current path.

7. The ramp signal generator of claim 6, wherein the replica current is derived by aggregating currents from one or more current mirror paths of the remaining current mirror paths and a current from the separate current mirror path.

8. The ramp signal generator of claim 1, wherein the replica current supply circuit generates the replica current according to an offset compensation ratio which is preset relative with the reference current from the current mirror paths selected by the reference current generation circuit.

9. A CMOS image sensor (CIS) comprising:
a pixel array suitable for outputting a pixel signal corresponding to incident light;
a row decoder suitable for selecting and controlling pixels within the pixel array for each row line according to a control of a control circuit;
a ramp signal generator suitable for generating a ramp signal according to the control of the control circuit, and compensating for the generated ramp signal by supplying a replica current to its output terminal;
a comparison circuit suitable for comparing pixel signals outputted from the pixel array to the ramp signal outputted from the ramp signal generator;
a counting circuit suitable for counting a clock applied from the control unit according to output signals from the comparison circuit;
a memory circuit suitable for storing counting information applied from the counting circuit under the control of the control unit; and
a column readout circuit suitable for outputting data of the memory circuit under the control of the control circuit, wherein the ramp signal generator comprises a plurality of current mirror paths for supplying currents to be used to generate the ramp signal, and the replica current is derived from the plurality of current mirror paths.

10. The CIS of claim 9, wherein the ramp signal generator comprises:
a reference current generation circuit suitable for generating a reference current based on a gain from the plurality of current mirror paths;
a ramp signal generation circuit suitable for generating the ramp signal according to the reference current from the reference current generation circuit;
a replica current supply circuit suitable for supplying the replica current using the plurality of current mirror paths; and
an offset compensation circuit suitable for compensating for an offset of the ramp signal generated through the ramp signal generation circuit using the replica current from the replica current supply circuit.

11. The CIS of claim 10, wherein when the reference current generation circuit generates the reference current from one or more current mirror paths selected from the plurality of current mirror paths, the replica current supply circuit generates the replica current from remaining current mirror paths not selected by the reference current generation circuit.

12. The CIS of claim 11, wherein the replica current supply circuit comprises a plurality of switches suitable for selecting the remaining current mirror paths.

13. The ramp signal generator of claim 11, wherein the replica current is derived by aggregating currents from one or more current mirror paths of the remaining current mirror paths.

14. The ramp signal generator of claim 11, wherein the replica current supply circuit further comprises a separate current mirror path used to generate the replica current only.

15. The ramp signal generator of claim 14, wherein the separate mirror current path is passed or interrupted by switching on or switching off a switch placed in the separate mirror current path.

16. The ramp signal generator of claim 14, wherein the replica current is derived by aggregating currents from one or more current mirror paths of the remaining current mirror paths and a current from the separate current mirror path.

17. The CIS of claim 10, wherein the replica current supply circuit generates the replica current according to an offset compensation ratio which is preset relative with the reference current from the current mirror paths selected by the reference current generation circuit.

* * * * *